United States Patent [19]
Hashim

[11] Patent Number: 6,107,578
[45] Date of Patent: *Aug. 22, 2000

[54] PRINTED CIRCUIT BOARD HAVING OVERLAPPING CONDUCTORS FOR CROSSTALK COMPENSATION

[75] Inventor: Amid Ihsan Hashim, Randolph, N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/783,950

[22] Filed: Jan. 16, 1997

[51] Int. Cl.$^7$ ....................................................... H05K 1/00
[52] U.S. Cl. ................................ 174/250; 174/261; 333/1
[58] Field of Search ........................... 174/250, 261, 174/36; 361/803, 777, 778; 257/776; 333/1, 238, 246

[56] References Cited

U.S. PATENT DOCUMENTS

| | | | |
|---|---|---|---|
| 3,398,232 | 8/1968 | Hoffman | 174/254 |
| 3,499,098 | 3/1970 | McGahey et al. | 174/261 |
| 3,838,317 | 9/1974 | Coyne | 317/119 |
| 3,846,166 | 11/1974 | Saiki et al. | 427/99 |
| 3,876,822 | 4/1975 | Day et al. | 174/68.5 |
| 4,287,394 | 9/1981 | Hargita et al. | 200/5 A |
| 4,362,899 | 12/1982 | Borrill | 174/36 |
| 5,430,247 | 7/1995 | Bockelman | 361/749 |
| 5,544,018 | 8/1996 | Sommerfeldt et al. | 361/792 |
| 5,646,368 | 7/1997 | Muyshondt et al. | 174/33 |
| 5,670,815 | 9/1997 | Childs et al. | 257/386 |

FOREIGN PATENT DOCUMENTS

| | | |
|---|---|---|
| 0 709 930 A2 | 5/1996 | European Pat. Off. . |
| 659 558 A5 | 1/1987 | Switzerland . |
| 2 269 941 | 2/1994 | United Kingdom . |
| 2 298 974 | 9/1996 | United Kingdom . |
| 2 314 466 | 12/1997 | United Kingdom . |

*Primary Examiner*—Jeffrey Gaffin
*Assistant Examiner*—Kamand Cuneo
*Attorney, Agent, or Firm*—Steve Mendelsohn

[57] ABSTRACT

Disclosed is a device for reducing crosstalk in an electrical connector. The device includes an insulating board with a plurality of layers. A first plurality of pairs of conductive paths is formed on a surface of at least one layer, and a second plurality of pairs of conductive paths is vertically spaced therefrom. The paths are arranged so that at least one conductive path in the first plurality of pairs overlies at least two conductive paths from different pairs in the second plurality of pairs. The capacitive coupling between the paths results in crosstalk having a polarity opposite to that of the connector so as to compensate for the connector crosstalk.

16 Claims, 4 Drawing Sheets

6,107,578

1

PRINTED CIRCUIT BOARD HAVING OVERLAPPING CONDUCTORS FOR CROSSTALK COMPENSATION

FIELD OF THE INVENTION

This invention relates to electrical connectors and in particular to a structure for reducing crosstalk in connectors.

BACKGROUND OF THE INVENTION

Standards for crosstalk in connectors has become increasingly stringent. For example, in category 5 of ANSI/TIA/EIA - 568A Standard, it is required that a 25 pair ribbon cable connector exhibit near-end crosstalk which is less than 40 dB at 100 MHz using the standard power sum measurement, which is the sum of crosstalk from all the pairs of the connector.

Recently, it has been proposed to produce a category 5 connector by inclusion of conductors in a side-by-side relation to provide crosstalk of a polarity opposite to the mating section of the connector. (See U.S. Pat. No. 5,562,479.) It has also been proposed to reduce crosstalk, for example in modular jacks, by crossing over certain conductors. (See U.S. Pat. No. 5,186,647 issued to Denkmann et al.) It has also been suggested that certain conductors in a modular jack could be mounted above certain other conductors to provide capacitive coupling and thereby induce opposite polarity crosstalk. The conductors could be formed as lead frames or printed on a printed circuit board. (See British Patent No. 2,271,678 issued to Pinney et al.)

It has also been suggested that a printed wiring board connector could compensate for crosstalk in its mating section by including capacitive coupling unbalance between conductor pairs which produced crosstalk of an opposite polarity. (See, U.S. patent application of Conorich, Ser. No. 08/673711, filed on Jun. 21, 1996.) Further, a device has been proposed for converting a connector to category 5 performance by providing vertically aligned conductor paths in a multi-layer board such that the paths form capacitor plates which capacitively couple adjacent conductor paths in order to produce crosstalk of a polarity opposite to the connector. (See, U.S. patent application of Choudhury, Ser. No. 08/668553, filed Jun. 21, 1996.)

SUMMARY OF THE INVENTION

The invention is a device for compensating for crosstalk in a connector. The device comprises an insulating board including a plurality of layers. A first plurality of pairs of conductive paths is formed on a major surface of one of the layers. A second plurality of pairs of conductive paths is vertically spaced from the first plurality of pairs. The conductive paths of at least one plurality are arranged in a serpentine configuration such that at least one conductive path in the first plurality of pairs overlies at least two conductive paths from different pairs in the second plurality of pairs. The paths produce crosstalk of a polarity which is opposite to that produced by the connector when a voltage is supplied to the paths.

BRIEF DESCRIPTION OF THE DRAWING

These and other features of the invention are delineated in detail in the following description. In the drawing.

2

Figure 2:
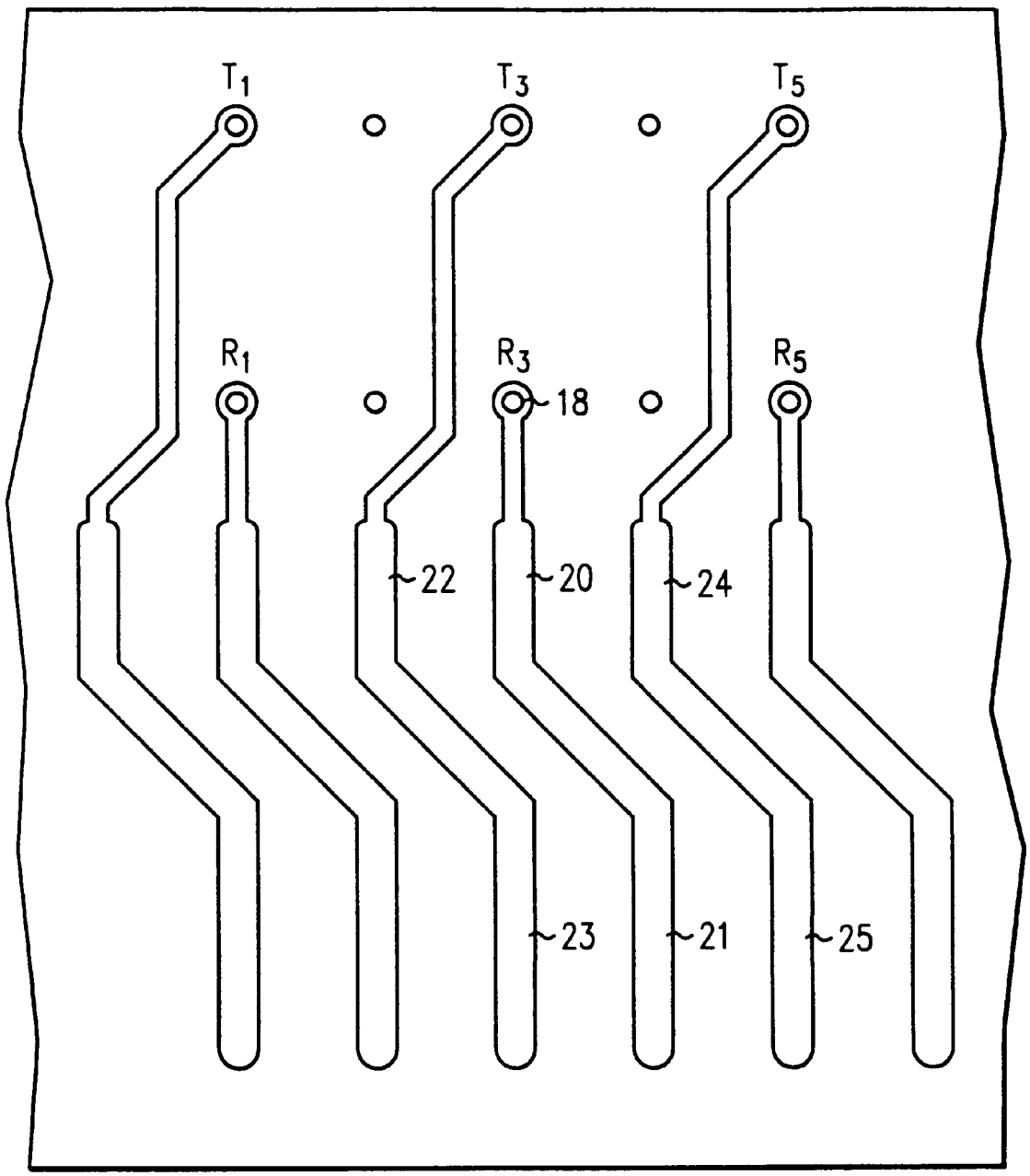
FIG. 2 is a plan view of one of the layers of the board depicted in FIG. 1.
Figure 3:
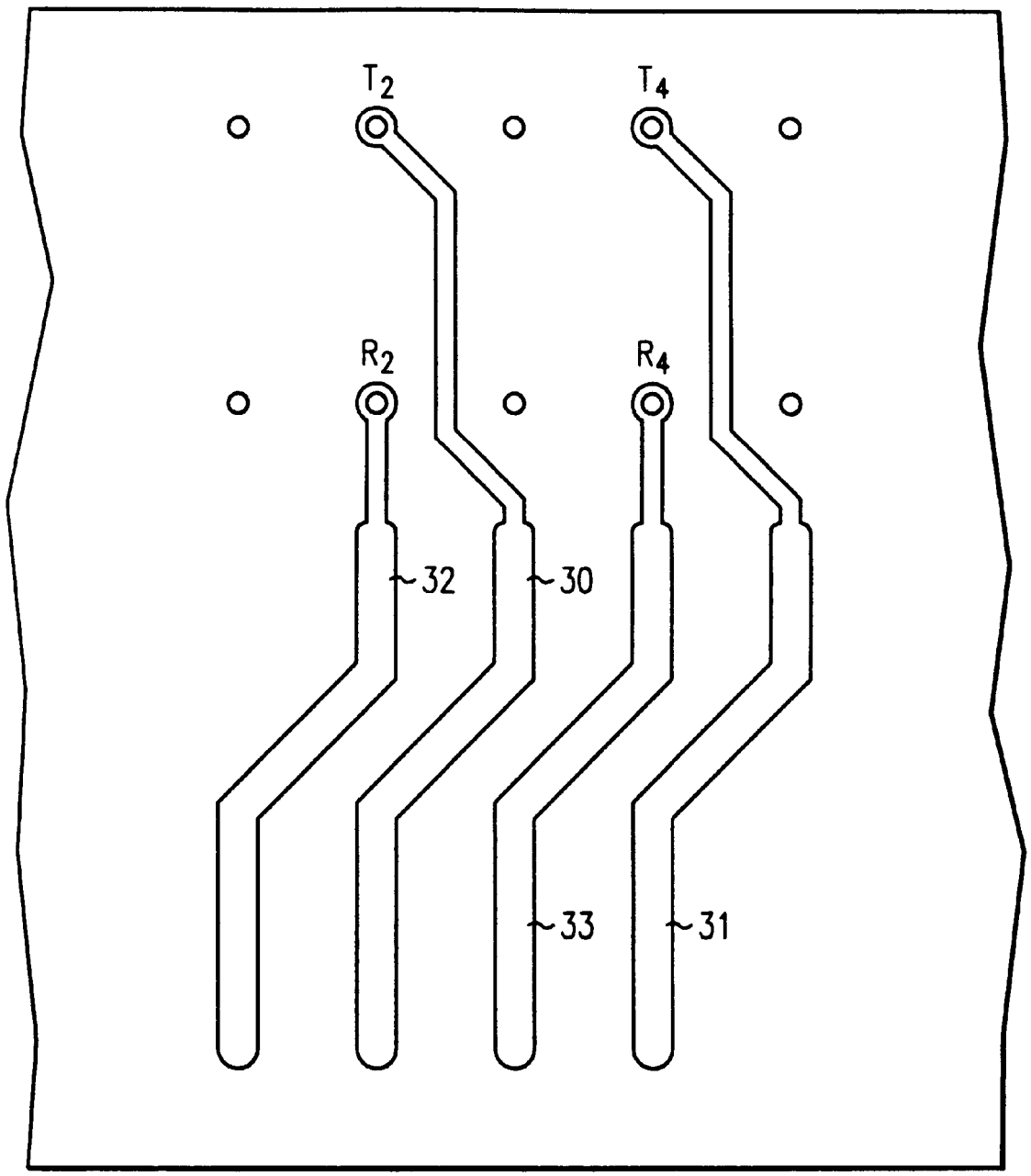

FIG. 3 is a plan view of a layer adjacent to that shown in FIG. 2; and

Figure 4:
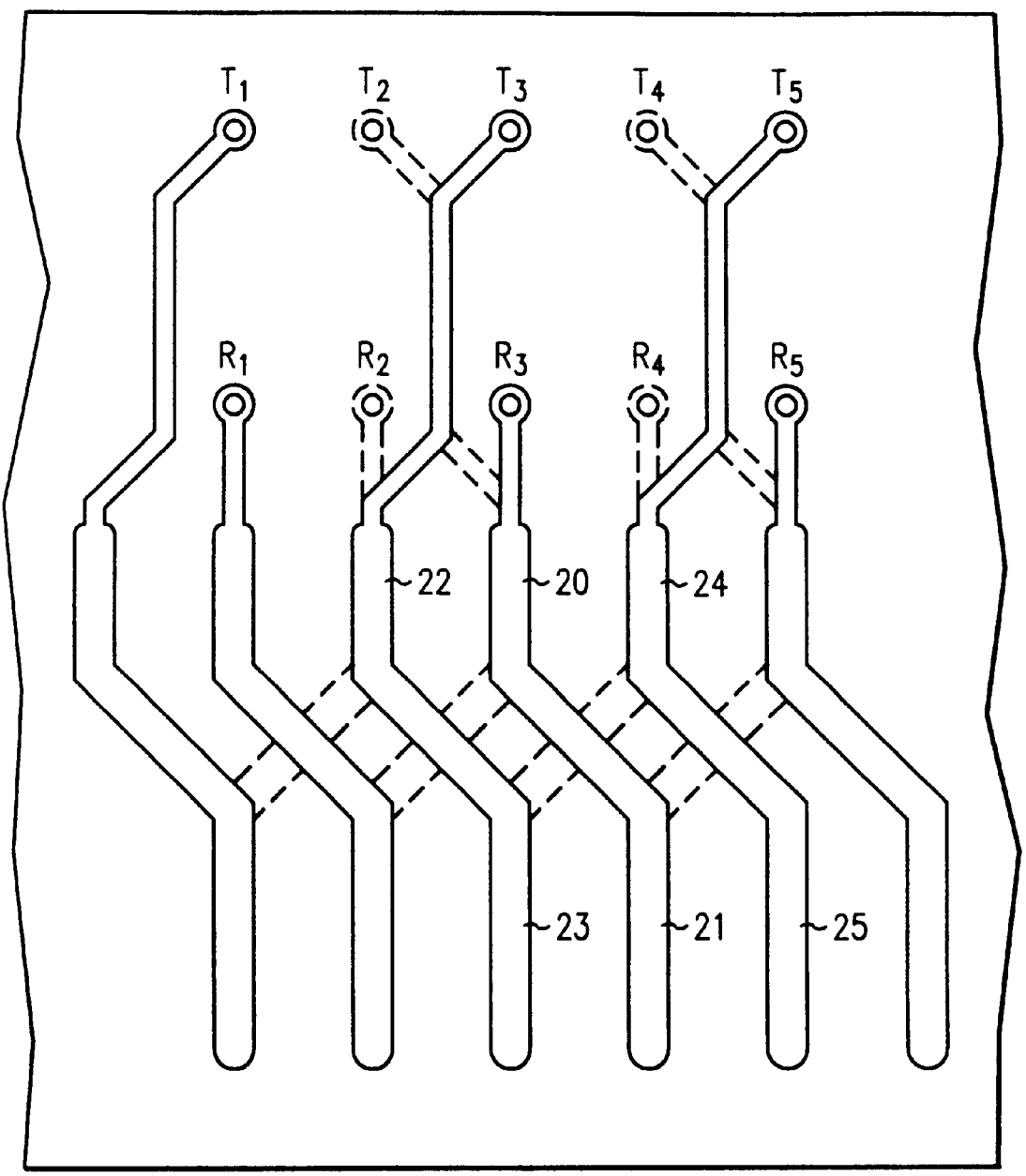

FIG. 4 is a superposition of certain features of the layers of FIGS. 2 and 3.

It will be appreciated that, for purposes of illustration, these figures are not necessarily drawn to scale.

DETAILED DESCRIPTION

Figure 1:
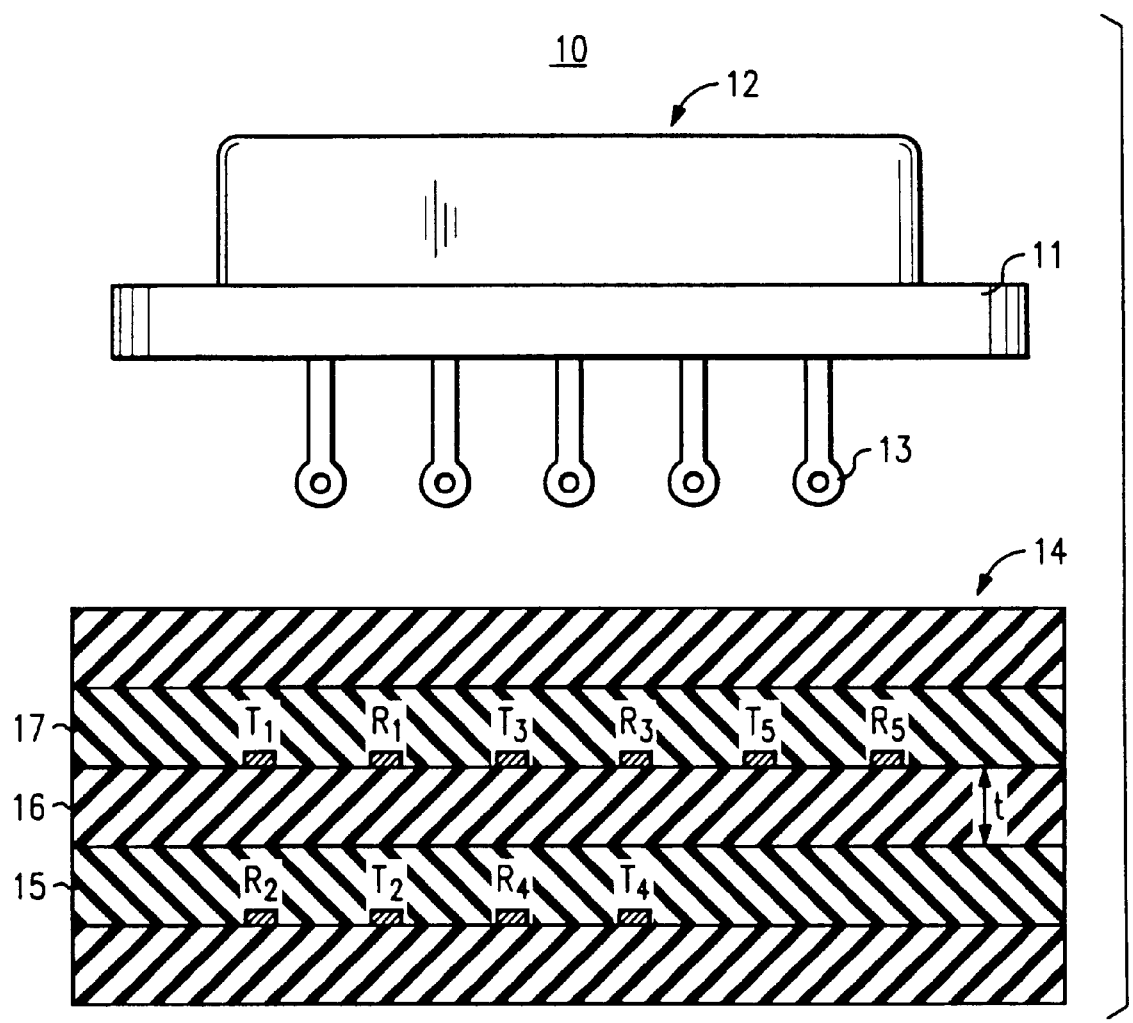
FIG. 1 is an exploded cross sectional view of an assembly in accordance with an embodiment of the invention.

Referring now to the drawings, in which like reference numerals identify similar or identical elements, FIG. 1 illustrates an assembly which will result in reduced crosstalk in accordance with an embodiment of the invention. A standard connector, 10, includes an insulating housing which encloses a plurality of contacts. As known in the art, the contacts are formed as opposite pairs, also known in the art as tip and ring contacts, so that at one end, the contacts form a mating section, 12, for receiving a standard cable connector (not shown). The other ends of the contacts are formed into pins or eyelets, e.g., 13, which are adapted for insertion into corresponding holes (illustrated in FIGS. 2–4) in a printed circuit board, 14. (It will be appreciated that in the view of FIG. 1, only the pins extending from the ring contacts are shown, and the pins extending from the tip contacts are behind the pins of the ring contacts in this view.) In this example, only five tip and ring pairs are shown for illustrative purposes. Typically, the connector, 10, would include many more pairs, such as 25 pairs.

The connector, 10, will produce a certain amount of crosstalk in the form of induced voltages of a certain polarity in the mating section, 12, as a result of the orientation of the tip and ring contacts. Unless some means are provided in the connector for reducing this crosstalk, the connector will usually not provide category 5 performance. However, by virtue of the structure of the printed circuit board, 14, to be described, crosstalk of a polarity opposite to that of the connector can be generated to reduce the overall power sum crosstalk loss to better than 40 dB at 100 MHz.

As illustrated in FIG. 1, the circuit board, 14, includes a plurality of layers, such as 16, which are formed according to standard techniques and are typically made of an epoxy glass material such as FR-4. The epoxy glass layers are held together by adhesive layers, e.g., 15 and 17, which are also typically made of FR-4. FR-4 is a material consisting of the reacted combination of difunctional epoxy and dicyandiamide impregnated into glass fabric. It is currently the material most commonly used as an insulated substrate in printed wiring boards. It is typically available in sheets, clad top and bottom with copper, called laminates. Etching techniques are used to remove parts of the copper cladding leaving copper traces where desired. In multilayer boards, unclad adhesive sheets also made from FR-4 material are used to bond the etched laminates together forming an alternating stack of laminates and adhesive sheets. FR-4 is just one possible substrate material that can be used to implement the present invention; other materials are also possible and the present invention should not be interpreted to be limited only to embodiments using FR-4. While five layers are shown in this example, it will be appreciated that any number of layers can be employed according to particular needs. The epoxy glass layers typically have a thickness, t, within the range 150 to 7600 microns.

Formed on the two major surfaces of at least one layer, 16, are a first and second plurality of pairs of conductive paths, which paths are designated with a T or an R to indicate electrical connection with corresponding tip or ring contacts in the connector. Thus, as shown in FIG. 2, the top surface of layer 16 includes three pairs of conductive paths, $T_1$-$R_1$, $T_3$-$R_3$, and $T_5$-$R_5$, while the bottom surface of layer 16, as shown in FIG. 3 and viewed from the top of the layer, includes two pairs labeled $R_2$-$T_2$ and $R_4$-$T_4$. Again, the number of pairs is illustrative only, and will correspond with the number of contact pairs in the connector, 10. The conductive paths are typically made of copper and are formed by standard photolithographic techniques to a typical thickness of 35.56 microns. Each conductive path, e.g., $R_3$, is coupled to a corresponding plated through hole, 18, to provide an electrical connection to the contacts of the connector 10 when the contacts of the connector are inserted in the holes.

In accordance with a key feature of the invention, each conductive path is formed in a serpentine pattern so that certain portions of at least one path will be vertically aligned with at least two paths of another type in another layer. FIG. 4 illustrates the overlap of the various paths, with the paths on the top of layer 16 ($T_1$-$R_1$, $T_3$-$R_3$, and $T_5$-$R_5$) shown in solid lines and the paths on the bottom of layer 16 ($T_2$-$R_2$ and $T_4$-$R_4$) shown in dashed lines. It will be noted for example, that path $R_3$ has a portion, 20, which overlies a portion, 30, of path $T_2$, and also has a portion, 21, which overlies a portion, 31, of path $T_4$. Similarly, path $T_3$ has a portion, 22, which overlies a portion, 32, of path $R_2$, and also has a portion, 23, which overlies a portion, 33, of path $R_4$.

In another feature of the invention, odd numbered pairs of conductive paths reside on one surface of a layer while even numbered pairs of conductive paths reside on the opposite surface of that same layer so that certain portions of at least one path of each pair will be adjacent on the same surface of a layer to certain portions of one path of another type of a next adjacent pair. It will be noted for example, that path $R_3$ has portions 20 and 21 on surface 16 adjacent to portions 24 and 25 of path $T_5$ on surface 16. Thus at least one path in a pair will have portions vertically aligned with an unlike path connected to an adjacent pair in connector, 10, and portions adjacent on the same surface with an unlike path connected to a next adjacent pair in connector, 10.

The result of this alignment will be that when the connector is operating and a voltage is thereby applied to the paths, at least selected paths, e.g., $R_3$, will be capacitively coupled to unlike paths, $T_2$ and $T_4$ in two adjacent pairs. This capacitive coupling between unlike paths produces capacitive coupling unbalance between adjacent pairs which results in near end crosstalk which is opposite in polarity to the crosstalk produced in the mating section of the connector, 10. Another result of this alignment will be that when the connector is operating and a voltage is applied to the paths, at least selected paths, e.g., $R_3$ will be capacitively coupled to an unlike path $T_5$ in a next adjacent pair. This capacitive coupling between unlike paths produces capacitive coupling unbalance between next adjacent pairs which also results in near end crosstalk which is opposite in polarity to the crosstalk produced in the mating section of the connector, 10. (As understood in the art, the term capacitive coupling unbalance describes the total capacitive coupling between two pairs contributing to differential crosstalk, i.e., the difference between capacitive coupling between unlike conductors in the pairs and capacitive coupling between like conductors in the pairs.) Therefore, by adjusting the capacitive coupling of the paths, the near end crosstalk in the connector can be essentially cancelled, or at least made better than 40 dB at 100 MHz. Further, since the power sum measurement takes into account the crosstalk produced by all pairs, the present arrangement is advantageous in that it provides coupling unbalance between a pair and at least its two adjacent pairs.

Specifically, the crosstalk in the mating section, 12, of the connector, 10, can be measured or calculated according to known techniques. (See, e.g., Application of Conorich, Ser. No. 08/673711, filed Jun. 21, 1996 which is incorporated by reference herein.) The mutual capacitive unbalance, Cm, and mutual inductance, Lm, between two adjacent pairs in the board 14, e.g., $T_3$-$R_3$ and $T_4$-$R_4$ are given by:

$$Cm = \frac{2\varepsilon_r \varepsilon_o l a}{t}$$

$$Lm = \frac{\mu_r \mu_o l}{2\pi} \ln\left[\frac{d^2 + t^2}{t^2}\right]$$

where $\varepsilon_o$ is the dielectric constant of free space, $\varepsilon_r$ is the dielectric constant of the board material (16), t is the thickness of the layer 16, l is the length of a straight portion of the paths (e.g., 20, 23), a is the width of the paths, $\mu_o$ is the permeability of free space, $\mu_r$ is the relative permeability of the board material and d is the horizontal separation between the centerlines of two adjacent paths.

The canceling near-end crosstalk, X, produced by the paths is then:

$$X = \frac{-Zs}{2}\left[j\omega\frac{Cm}{4} + j\omega\frac{Lm}{Zs^2}\right]$$

where the minus sign indicates that the crosstalk is 180 degrees out of phase with the crosstalk produced in the mating section due to the fact that the paths are capacitively coupled to unlike paths in adjacent pairs, and where Zs is the source or load impedance and to is the angular frequency of the applied signal.

Thus, t, l, $\varepsilon_r$ and a can be chosen so that the magnitude of the crosstalk produced in the board is essentially equal to the magnitude of crosstalk in the mating section. In one example, the length, l, of the paths was 0.002 meters, the thickness, t, of the layer was 0.00015 meters, $\varepsilon_4$ was 4.5, the width of the path, a, was 0.00091 meters, and the horizontal separation between adjacent paths, d, was 0.00216 m. A power sum crosstalk of 40 dB at the frequency of 100 MHz for the combination connector and board could be obtained by choosing the above parameters.

While the figures show only two layers of conductive paths, it will be appreciated that the board could include several more layers of paths on the major surfaces of the dielectric layers. These additional layers could also provide opposite polarity crosstalk in the manner described or provide other functions such as fanouts.

The invention claimed is:

1. A device for reducing crosstalk in a connector, the device being adapted to be mated with the connector and comprising:

an insulating board having one or more layers;

a first set of two or more pairs of conductive paths formed on a first surface of one of the layers;

a second set of one or more pairs of conductive paths vertically spaced from the first set, wherein:

each pair of conductive paths in the first and second sets comprises a conductive path of a first type T and a conductive path of a second type R;

the first set comprises a first pair of conductive paths $T_1$, $R_1$, and a third pair of conductive paths $T_3$, $R_3$;

the second set comprises a second pair of conductive paths $T_2$, $R_2$;

the first pair is adjacent to the third pair;

portions of two conductive paths $P_i$ and $P_j$ are said to be co-aligned when the conductive paths $P_i$ and $P_j$ lie on different mutually parallel surfaces and a projection, perpendicular to the mutually parallel surfaces, of a portion of the conductive path $P_i$ coincides with and is parallel to a portion of the conductive path $P_j$;

a first portion of the conductive path $R_2$ is co-aligned with a second portion of the conductive path $T_3$ in order to contribute to a first type of compensating coupling having polarity opposite that of crosstalk generated in the connector between like conductors;

a second portion of the conductive path $R_2$ is co-aligned with a portion of the conductive path $T_1$ in order to contribute to the first type of compensating coupling;

a second portion of the conductive path $T_2$ is co-aligned with a first portion of the conductive path $R_3$ in order to contribute to the first type of compensating coupling; and a third portion of the conductive path $T_2$ is co-aligned with a portion of the conductive path $R_1$ in order to contribute to the first type of compensating coupling.

2. The device of claim 1, wherein:

the conductive paths $T_1$, $T_2$, and $T_3$ are tip type conductive paths; and the conductive paths $R_1$, $R_2$, and $R_3$ are ring type conductive paths.

3. The device of claim 1, wherein the second set is formed on a second surface of said one of the layers.

4. The device of claim 1, wherein each of the conductive paths $T_1$, $R_1$, $T_2$, $R_2$, $T_3$, and $R_3$ is connectable to a contact in the connector.

5. The device of claim 1, wherein, on the first surface:

conductive path $R_1$ is immediately adjacent to and lies between conductive paths $T_1$ and $T_3$ in order to contribute to a second type of compensating coupling having polarity opposite that of crosstalk generated in the connector between like conductors; and conductive path $T_3$ is immediately adjacent to and lies between conductive paths $R_1$ and $R_3$ in order to contribute to the second type of compensating coupling.

6. The device of claim 1, wherein a first portion of the conductive path $T_2$ is co-aligned with a first portion of the conductive path $T_3$.

7. The device of claim 1, wherein:

the first set further comprises a fifth pair of conductive paths $T_5$, $R_5$;

the second set further comprises a fourth pair of conductive paths $T_4$, $R_4$;

the second pair is adjacent to the fourth pair;

the third pair is adjacent to the fifth pair;

a first portion of the conductive path $R_4$ is co-aligned with a second portion of the conductive path $T_5$ in order to contribute to the first type of compensating coupling;

a second portion of the conductive path $R_4$ is co-aligned with a third portion of the conductive path $T_3$ in order to contribute to the first type of compensating coupling;

a second portion of the conductive path $T_4$ is co-aligned with a portion of the conductive path $R_5$ in order to contribute to the first type of compensating coupling; and a third portion of the conductive path $T_4$ is co-aligned with a second portion of the conductive path $R_3$ in order to contribute to the first type of compensating coupling.

8. The device of claim 7, wherein:

the conductive paths $T_1$, $T_2$, $T_3$, $T_4$, and $T_5$ are tip type conductive paths;

the conductive paths $R_1$, $R_2$, $R_3$, $R_4$, and $R_5$ are ring type conductive paths;

the second set is formed on a second surface of said one of the layers;

each of said conductive paths is connectable to a contact in the connector;

on the first surface:

conductive path $R_1$ is immediately adjacent to and lies between conductive paths $T_1$ and $T_3$ in order to contribute to a second type of compensating coupling having polarity opposite that of crosstalk generated in the connector between like conductors;

conductive path $T_3$ is immediately adjacent to and lies between conductive paths $R_1$ and $R_3$ in order to contribute to the second type of compensating coupling;

conductive path $R_3$ is immediately adjacent to and lies between conductive paths $T_3$ and $T_5$ in order to contribute to the second type of compensating coupling; and conductive path $T_5$ is immediately adjacent to and lies between conductive paths $R_3$ and $R_5$ in order to contribute to the second type of compensating coupling; and on the second surface:

conductive path $T_2$ is immediately adjacent to and lies between conductive paths $R_2$ and $R_4$ in order to contribute to the second type of compensating coupling; and conductive path $R_4$ is immediately adjacent to and lies between conductive paths $T_2$ and $T_4$ in order to contribute to the second type of compensating coupling.

9. The device of claim 8, wherein:

a first portion of the conductive path $T_2$ is co-aligned with a first portion of the conductive path $T_3$; and a first portion of the conductive path $T_4$ is co-aligned with a first portion of the conductive path $T_5$.

10. The device of claim 7, wherein:

a first portion of the conductive path $T_2$ is co-aligned with a first portion of the conductive path $T_3$; and a first portion of the conductive path $T_4$ is co-aligned with a first portion of the conductive path $T_5$.

11. The device of claim 10, wherein:

the first portion of the conductive path $T_2$ is not collinear with any other portion of any conductive path in the device;

the first portion of the conductive path $T_3$ is not collinear with any other portion of any conductive path in the device;

the first portion of the conductive path $T_4$ is not collinear with any other portion of any conductive path in the device; and the first portion of the conductive path $T_5$ is not collinear with any other portion of any conductive path in the device.

12. The device of claim 7, wherein:

the first portion of the conductive path $R_2$ is non-collinear with the second portion of the conductive path $R_2$;

the second portion of the conductive path $T_2$ is non-collinear with the third portion of the conductive path $T_2$;

the first portion of the conductive path $R_3$ is non-collinear with the second portion of the conductive path $R_3$;

the second portion of the conductive path $T_3$ is non-collinear with the third portion of the conductive path $T_3$;

the first portion of the conductive path $R_4$ is non-collinear with the second portion of the conductive path $R_4$; and the second portion of the conductive path $T_4$ is non-collinear with the third portion of the conductive path $T_4$.

13. The device of claim 12, wherein:

the first portion of the conductive path $R_2$ is collinear with the third portion of the conductive path $T_2$;

the second portion of the conductive path $T_3$ is collinear with the portion of the conductive path $R_1$;

the first portion of the conductive path $R_3$ is collinear with the third portion of the conductive path $T_3$;

the second portion of the conductive path $T_2$ is collinear with the second portion of the conductive path $R_4$;

the first portion of the conductive path $R_4$ is collinear with the third portion of the conductive path $T_4$; and the second portion of the conductive path $T_5$ is collinear with the second portion of the conductive path $R_3$.

14. The device of claim 1, wherein each of the conductive paths $T_1$, $R_1$, $T_2$, $R_2$, $T_3$, and $R_3$ is capable of simultaneously carrying a different signal.

15. The device of claim 1, wherein:

the first portion of the conductive path $R_2$ is non-collinear with the second portion of the conductive path $R_2$; and the second portion of the conductive path $T_2$ is non-collinear with the third portion of the conductive path $T_2$.

16. The device of claim 15, wherein:

the first portion of the conductive path $R_2$ is collinear with the third portion of the conductive path $T_2$; and the second portion of the conductive path $T_3$ is collinear with the portion of the conductive path $R_1$.

* * * * *

UNITED STATES PATENT AND TRADEMARK OFFICE
CERTIFICATE OF CORRECTION

PATENT NO. : 6,107,578
DATED : August 22, 2000
INVENTOR(S) : Amid Ihsan Hashim

It is certified that error appears in the above-identified patent and that said Letters Patent is hereby corrected as shown below:

On the title page in References Cited [56], add:
--5,586,914    12/1996    Foster    439/676--.

Signed and Sealed this

Seventh Day of August, 2001

Attest:

*Nicholas P. Godici*

NICHOLAS P. GODICI
*Attesting Officer*   *Acting Director of the United States Patent and Trademark Office*